(12) United States Patent
Jing et al.

(10) Patent No.: US 11,207,707 B2
(45) Date of Patent: Dec. 28, 2021

(54) CURVED SURFACE COATING DEVICE FOR CURVED SURFACE DISPLAY PANEL AND GLUE COATING APPARATUS

(71) Applicants: Hefei BOE Optoelectronics Technology Co., Ltd., Anhui (CN); BOE TECHNOLOGY GROUP CO., LTD., Beijing (CN)

(72) Inventors: Yangkun Jing, Beijing (CN); Nan Gao, Beijing (CN)

(73) Assignees: Hefei BOE Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 334 days.

(21) Appl. No.: 16/321,780

(22) PCT Filed: Mar. 20, 2018

(86) PCT No.: PCT/CN2018/079665
§ 371 (c)(1),
(2) Date: Jan. 29, 2019

(87) PCT Pub. No.: WO2018/171590
PCT Pub. Date: Sep. 27, 2018

(65) Prior Publication Data
US 2021/0008586 A1 Jan. 14, 2021

(30) Foreign Application Priority Data
Mar. 22, 2017 (CN) .......................... 201710174583.3

(51) Int. Cl.
*B05C 5/02* (2006.01)
*B05C 11/10* (2006.01)
(Continued)

(52) U.S. Cl.
CPC .............. *B05C 5/0254* (2013.01); *B05C 5/02* (2013.01); *B05C 5/0225* (2013.01);
(Continued)

(58) Field of Classification Search
CPC .......................... B05C 5/0254; B05C 11/1013
(Continued)

(56) References Cited

U.S. PATENT DOCUMENTS 982,939 A * 1/1911 Cummings ............. B05C 1/025
118/241
2,687,111 A * 8/1954 Deniston ................... B05C 1/10
118/256
(Continued)

FOREIGN PATENT DOCUMENTS

CN 1620340 A 5/2005
CN 101382633 A 3/2009
(Continued)

OTHER PUBLICATIONS

Chinese Office Action dated Jul. 3, 2018, from application No. 201710174583.3.
(Continued)

*Primary Examiner* — Karl Kurple
(74) *Attorney, Agent, or Firm* — Arch & Lake LLP

(57) ABSTRACT

The present disclosure provides a curved surface coating device. The curved surface coating device includes a bracket having a first and second ends. The curved surface coating device includes a glue coating portion connected with the first end of the bracket. The curved surface coating device includes a transmission member connected between the first and second ends of the bracket and its distance from the first end of the bracket is adjustable. The curved surface coating device includes a first driving mechanism connected with the transmission member for driving the bracket to rotate
(Continued)

about the transmission member as a center of rotation. The curved surface coating device includes a second driving mechanism connected with the bracket for driving the bracket to move on a line where the first end and the second end are located.

6 Claims, 2 Drawing Sheets

(51) Int. Cl.
    *B65D 83/00*     (2006.01)
    *B05D 1/26*     (2006.01)
    *B05C 17/005*     (2006.01)
    *B05C 17/015*     (2006.01)
    *B23K 3/06*     (2006.01)
    *B67D 3/04*     (2006.01)
    *G01N 35/10*     (2006.01)
    *H05B 33/10*     (2006.01)
    *H05K 13/04*     (2006.01)

(52) U.S. Cl.
    CPC ........ *B05C 5/0258* (2013.01); *B05C 11/1013* (2013.01); *B05C 11/1015* (2013.01); *B05C 11/1018* (2013.01); *B65D 83/0022* (2013.01); *B05C 17/00516* (2013.01); *B05C 17/00533* (2013.01); *B05D 1/26* (2013.01); *B23K 3/0638* (2013.01); *B67D 3/043* (2013.01); *G01N 35/1009* (2013.01); *H05B 33/10* (2013.01); *H05K 13/0469* (2013.01); *H05K 2203/0126* (2013.01)

(58) Field of Classification Search
    USPC ......................................................... 118/241
    See application file for complete search history.

(56) References Cited

U.S. PATENT DOCUMENTS

| | | | | |
|---|---|---|---|---|
| 3,425,393 A * | 2/1969 | Shuh | ...................... | B31B 50/00 118/681 |
| 3,555,778 A * | 1/1971 | Kapare | ................... | B65B 7/025 53/375.4 |
| 3,940,072 A * | 2/1976 | Ishikawa | ............... | B05B 15/652 239/525 |
| 4,179,325 A * | 12/1979 | Staats | ................... | B05C 5/0254 156/498 |
| 4,231,318 A * | 11/1980 | Zink | .................... | B05C 1/0834 118/122 |
| 4,764,234 A * | 8/1988 | Smits | ................ | A61F 13/15593 118/241 |
| 6,010,740 A * | 1/2000 | Rutledge | ............... | B05C 5/0216 427/8 |
| 8,490,571 B2 * | 7/2013 | Sato | ...................... | G02F 1/1303 118/58 |
| 9,162,249 B2 * | 10/2015 | Koyama | ............ | B05C 11/1034 |
| 9,289,791 B2 * | 3/2016 | Uematsu | ................. | B05B 15/68 |
| 9,630,396 B2 | 4/2017 | Orr | | |
| 9,884,329 B2 * | 2/2018 | Pringle, IV | .......... | B05C 5/0216 |
| 9,931,665 B2 * | 4/2018 | Cheung | ................ | B05C 5/0225 |
| 10,441,966 B2 * | 10/2019 | Liu | ........................... | B05B 3/02 |
| 10,569,288 B2 * | 2/2020 | Holloway | .................. | B25J 5/00 |
| 11,065,630 B2 * | 7/2021 | Hernandez | ............ | B05B 7/0093 |
| 2005/0048196 A1 * | 3/2005 | Yanagita | ............. | B05C 11/1013 427/8 |
| 2009/0167817 A1 | 7/2009 | Orr | | |
| 2012/0200626 A1 | 8/2012 | Orr | | |
| 2013/0078378 A1 * | 3/2013 | Ishihara | ............... | B05D 3/0466 427/299 |
| 2013/0314460 A1 | 11/2013 | Orr | | |
| 2015/0165458 A1 * | 6/2015 | Funakoshi | ................ | B05B 9/03 118/302 |
| 2016/0114348 A1 * | 4/2016 | Cheung | ................. | B05C 17/012 222/333 |
| 2018/0056521 A1 * | 3/2018 | Miyamoto | ............. | B25J 13/085 |
| 2018/0236480 A1 * | 8/2018 | Krusor | .................... | B05C 1/027 |
| 2018/0236482 A1 * | 8/2018 | Zeng | ........................ | B05D 1/26 |
| 2018/0333848 A1 * | 11/2018 | Igarashi | ............... | B25J 11/0075 |
| 2020/0206773 A1 * | 7/2020 | Hattori | ................ | B05C 11/1021 |
| 2020/0324311 A1 * | 10/2020 | Barbarit | ............... | B25J 11/0075 |

FOREIGN PATENT DOCUMENTS

| | | |
|---|---|---|
| CN | 101676802 A | 3/2010 |
| CN | 102909164 A | 2/2013 |
| CN | 103909743 A | 7/2014 |
| CN | 203955454 U | 11/2014 |
| CN | 105026051 A | 11/2015 |
| CN | 105289932 A | 2/2016 |
| CN | 105562290 A | 5/2016 |
| CN | 105597996 A | 5/2016 |
| CN | 105700295 A | 6/2016 |
| CN | 205308725 U | 6/2016 |
| CN | 105772340 A | 7/2016 |
| CN | 106694319 A | 5/2017 |
| JP | H04266086 | 9/1992 |
| JP | 2004-167422 A | 6/2004 |
| JP | 2010012391 A | 1/2010 |
| JP | 2012143691 A | 8/2012 |
| JP | 2013094742 A | 5/2013 |
| JP | 2014-024046 A | 2/2014 |
| JP | 5544710 B2 | 7/2014 |
| KR | 20150125935 A | 11/2015 |
| WO | WO-2009/088864 A1 | 7/2009 |
| WO | WO-2014/132831 A1 | 9/2014 |
| WO | WO-2017/197927 A1 | 11/2017 |

OTHER PUBLICATIONS

International Search Report and Written Opinion dated Jun. 15, 2018, from application No. PCT/CN2018/079665.

* cited by examiner

CURVED SURFACE COATING DEVICE FOR CURVED SURFACE DISPLAY PANEL AND GLUE COATING APPARATUS

CROSS-REFERENCE TO RELATED APPLICATIONS

The present disclosure is based on International Application No. PCT/CN2018/079665, filed on Mar. 20, 2018, which is based on and claims priority to Chinese Patent Application No. 2017/10174583.3, entitled "curved surface coating device and glue coating apparatus", filed on Mar. 22, 2017, the entire contents of which is hereby incorporated by reference.

TECHNICAL FIELD

The present disclosure relates to the field of glue coating apparatuses, and in particular to a curved surface coating device and a glue coating apparatus having the same.

BACKGROUND

At present, the application of a novel display panel, which has a curvature or which is bendable, in a terminal such as a television, a mobile phone and a wearable device based on OLED (Organic Light-Emitting Diode) technology is increasingly popular. This kind of display panel is typically a flexible curved plate, such as a glass substrate which has a curvature or which is bendable.

In the related art, the OLED substrate has a curvature or is bendable. In the manufacturing process, when the OLED substrate is coated with a sealant by using a glue coating apparatus, the coating is uneven due to the curvature. At present, when the flexible bendable substrate is coated, the coating process relative to the planar substrate is quite difficult to be controlled and has poor controllability, thus resulting in uneven coating thickness on the surface of the OLED substrate, and thus affecting the display quality of a final curved surface display panel.

Therefore, it is necessary to provide a new technical solution to improve one or more problems existing in the prior art.

It should be noted that the information disclosed in the background section above is only intended to enhance understanding of the background of the present disclosure, and thus may include information that does not constitute prior art known to those of ordinary skill in the art.

SUMMARY

According to a first aspect of an arrangement of the present disclosure, a curved surface coating device is provided. The curved surface coating device includes a bracket having a first end and a second end. The curved surface coating device includes a glue coating portion connected with the first end of the bracket. The curved surface coating device includes a transmission member connected between the first end and the second end of the bracket. A distance between the first end and the transmission member is adjustable. The curved surface coating device includes a first driving mechanism connected with the transmission member, said the first driving mechanism configured to drive the bracket to rotate about the transmission member as a center of rotation. The curved surface coating device includes a second driving mechanism connected with the bracket configured to drive the bracket to move on a line where the first end and the second end are located. In an exemplary arrangement of the present disclosure, the glue coating portion includes a coating head having a circular arc surface with a slit. The glue coating portion includes a glue storage chamber, one end of which is hermetically connected with the coating head. The glue coating portion includes a pushing portion located within the glue storage chamber and matching a size of the glue storage chamber. The glue coating portion includes a transmission rod, a first end of which extends into the glue storage chamber and is connected with the pushing portion. The glue coating portion includes a third driving mechanism connected with a second end of the transmission rod configured to drive the transmission rod with an axial movement along the glue storage chamber.

In an exemplary arrangement of the present disclosure, the first driving mechanism, the second driving mechanism, and the third driving mechanism each includes a motor.

In an exemplary arrangement of the present disclosure, the transmission member is a rotation shaft.

In an exemplary arrangement of the present disclosure, the curved surface coating device further includes a control mechanism electrically connected with the first driving mechanism, the second driving mechanism and the third driving mechanism for controlling respective power outputs of the first driving mechanism, the second driving mechanism and the third driving mechanism.

In an exemplary arrangement of the present disclosure, the control mechanism includes a parameter acquisition unit for acquiring a rotation speed parameter, a gap parameter from substrate, and a coating pressure parameter. The control mechanism includes a motion control unit connected with the parameter acquisition unit for controlling the power output of the first driving mechanism according to the rotation speed parameter, the power output of the second driving mechanism according to the gap parameter, and the power output of the third driving mechanism according to the coating pressure parameter.

In an exemplary arrangement of the present disclosure, a gap ranges from 10 um to 30 um.

According to a second aspect of an arrangement of the present disclosure, there is provided a glue coating apparatus including the curved surface coating device described in any of the above arrangements.

In an exemplary arrangement of the present disclosure, the glue coating apparatus further includes a feed passage for receiving a coating glue. The glue coating apparatus further includes a material circulation passage connected between the feed passage and the glue storage chamber of the glue coating portion.

In an exemplary arrangement of the present disclosure, a volume of the material circulation passage is larger than the glue storage chamber.

The above general description and the following detailed description are intended to be illustrative and not restrictive of the present disclosure.

BRIEF DESCRIPTION OF THE DRAWINGS

The accompanying drawings are incorporated in and constitute part of the specification, show the arrangements of the present disclosure and are intended to explain the principle of the present disclosure together with the description. It is apparent that the accompanying drawings in the following description are only some of the arrangements of the present disclosure, and other drawings may be acquired from these accompanying drawings by those skilled in the art without any creative work.

DETAILED DESCRIPTION

Figure 1:
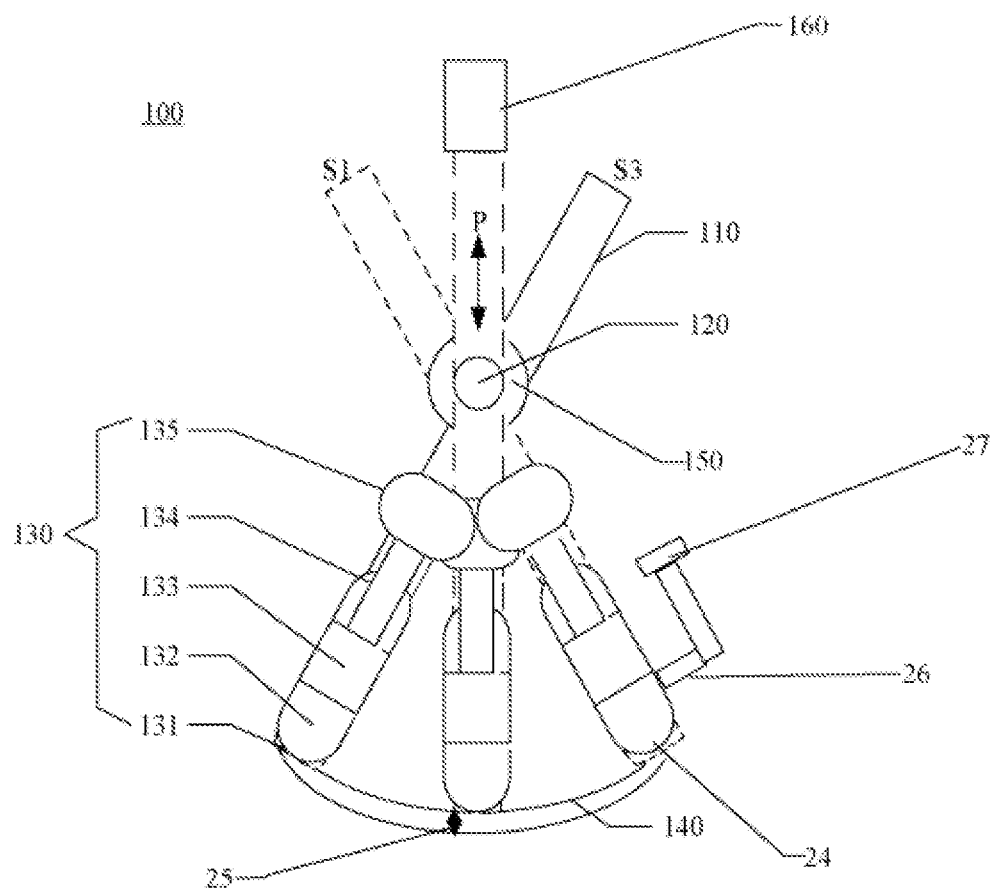
FIG. 1 schematically shows a schematic structural view of a curved surface coating device in an exemplary arrangement of the present disclosure.

Example arrangements will now be described more fully with reference to the accompanying drawings. However, the example arrangements can be embodied in a variety of forms, and should not be construed as being limited to the arrangements set forth herein; rather, these arrangements are provided so that this disclosure will be thorough and complete, and the concepts of the example arrangements will be fully given to those skilled in the art. The described features, structures, or characteristics may be combined in one or more arrangements in any suitable manner.

In addition, the drawings are merely schematic representations of the present disclosure and are not necessarily to scale. The same reference numbers in the drawings denote the same or similar parts, and the repeated description thereof will be omitted.

Figure 2:
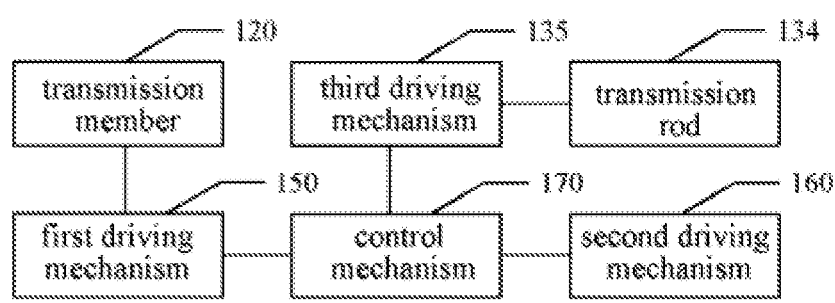
FIG. 2 schematically shows a control schematic view of a curved surface coating device in an exemplary arrangement of the present disclosure.

First, the present exemplary arrangement provides a curved surface coating device. Referring to FIGS. 1 and 2, the curved surface coating device 100 may include a bracket 110, a glue coating portion 130, a transmission member 120, a first driving mechanism 150, and a second driving mechanism 160. The bracket 110 includes a first end and a second end. The glue coating portion 130 is connected with the first end of the bracket 110. The transmission member 120 is connected between the first end and the second end of the bracket 110 and its distance from the first end of the bracket 110 is adjustable. The first driving mechanism 150 is connected with the transmission member 120 (not shown), said the first driving mechanism is configured to drive the bracket 110 to rotate about the transmission member 120 as a center of rotation. The second driving mechanism 160 is connected with the bracket 110 (not shown) for driving the bracket 110 to move on a line where the first end and the second end are located.

In the above curved surface coating device, the bracket brings the glue coating portion to rotate in order to coat on a surface of the curved plate by cooperation of the bracket, the transmission member, the first driving mechanism and the second driving mechanism, and the linear motion of the bracket may change a gap distance between the glue coating portion and the surface of the curved plate during the coating process. In this way, on the one hand, a coating radius may be adjusted according to a radian of curved surface of the curved plate, a local protrusion or the like during the coating process to apply the coating glue with high precision and uniformity; on the other hand, compared with the related art, the controllability for controlling the coating process of the curved plate is good, and the thickness of the glue on the surface of the curved plate is more uniform after coating, thus improving the display quality of the curved display screen.

Hereinafter, each portion of the above-described curved surface coating device in the present exemplary arrangement will be described in more detail with reference to FIGS. 1 to 4.

Referring to FIG. 1, the bracket 110 may include a first end and a second end. Illustratively, the bracket 110 may be a rectangular or other shaped bracket. The first end may be a lower end when the bracket 110 is in a vertical position (i.e., a S2 position), and the second end may be an upper end. The transmission member 120 may be fixedly mounted between the upper end and the lower end of the bracket 110, for example, the transmission member 120 is fixedly mounted at an intermediate position between the upper end and the lower end of the bracket 110, and of course, it will not be limited thereto. The glue coating portion 130 is connected with the first end of the bracket 110. Illustratively, the glue coating portion 130 may be connected with the lower end of the bracket 110 and matched with the curved surface substrate 140 to be coated. The transmission member 120 may be connected between the first end (such as the lower end) and the second end (such as the upper end) of the bracket 110 and its distance from the first end (such as the lower end) of the bracket 110 is adjustable. Illustratively, the transmission member 120 may be a rotation shaft, and may of course be other rotation components, which will not be particularly limited.

The first driving mechanism 150 is connected with the transmission member 120 (such as a rotation shaft), and the first driving mechanism 150 may include a motor. A rotation shaft of the motor may be connected with the transmission member 120 to drive the transmission member 120 to rotate. The first driving mechanism 150 may be used to drive the bracket 110 to rotate about the transmission member 120 as a center of rotation. Thus, the bracket 110 may bring the glue coating portion 130 to rotate on the surface of the curved surface substrate 140 to perform a coating operation. The first driving mechanism 150 may control a rotation range of the glue coating portion 130, for example, it rotates within a rotation range defined from position S1 to position S3 when the bracket 110 moves.

The second driving mechanism 160 is also connected with the bracket 110 (not shown). Illustratively, the second driving mechanism 160 may also include a motor, and is configured to drive the bracket 110 to move on a line where the first end (such as the lower end) and the second end (such as the upper end) are located, for example, move upwards or downwards in the direction P. For example, the second driving mechanism 160 may control a position of the transmission member 120 (i.e., the rotation shaft) to bring the bracket 110 to linearly move. In this way, when the bracket 110 brings the glue coating portion 130 to rotate on the surface of the curved surface substrate 140 to perform a coating operation, a coating radius of the glue coating portion 130 may also be adjusted according to a curvature of the curved surface substrate 140 to be coated, i.e., a gap between the glue coating portion 130 and the surface of the curved surface substrate 140 may be dynamically adjusted, or the glue coating portion 130 may control based on a height axis (corresponding to the P direction) for controlling the coating thickness. The device may adjust the coating radius of the glue coating portion 130 according to the curvature of curved surface of the curved surface substrate 140, the local protrusion or the like during the coating process to apply the coating glue with high precision and uniformity. The glue coating portion 130 will be described in detail below.

With continued reference to FIG. 1, in an exemplary arrangement, the glue coating portion 130 may include a coating head 131, a glue storage chamber 132, a pushing portion 133, a transmission rod 134, and a third driving mechanism 135. The coating head 131 includes a circular arc-shaped surface having a slit. The coating head 131 having a circular arc-shaped surface may match with the curved surface substrate 140 having a certain curvature so that coating is performed more uniformly. Illustratively, the coating head 131 may be a coating nozzle. One end of the glue storage chamber 132 is hermetically connected with the coating head 131. The glue storage chamber 132 may be used to store a coating glue. The pushing portion 133 is located in the glue storage chamber 132 and matches with a size of the glue storage chamber 132. The pushing portion 133 is similar to a piston head, and may reduce a space in the glue storage chamber 132 to generate an outward thrust to the coating glue, so that the coating glue in the glue storage chamber 132 may be extruded from the slit of the coating head 131 (not shown). A first end of the transmission rod 134 extends into the glue storage chamber 132 and is connected with the pushing portion 133. The third driving mechanism 135 is connected with a second end of the transmission rod 134 for driving the transmission rod 134 with an axial movement along the glue storage chamber 132. In this way, the third driving mechanism 135 may drive the transmission rod 134 with an axial movement along the glue storage chamber 132, thus driving the pushing portion 133 at the glue storage chamber 132 with an axial movement to extrude the coating glue from the slit on the coating head 131. Illustratively, the third driving mechanism 135 may each include a motor which may adopt a stepping motor. The stepping motor may control a discharge amount of the coating glue. Thus, the coating effect can be controlled more efficiently during the coating process of glue coating portion 130 is controlled by the third driving mechanism 135. For example, when the surface of the curved surface substrate 140 to be coated is coated, the thickness of the glue is uniform, thus improving the display quality of the final curved display screen.

Referring to FIG. 2, in an exemplary arrangement, the device 100 may further include a control mechanism 170, which may include a PLC (Programmable Logic Controller) control unit. The control mechanism 170 may be electrically connected with the first driving mechanism 150, the second driving mechanism 160, and the third driving mechanism 135 for controlling power outputs of the first driving mechanism 150, the second driving mechanism 160 and the third driving mechanism 135. That is, power outputs of the first driving mechanism 150, the second driving mechanism 160, and the third driving mechanism 135 may be controlled by the PLC control unit, thus controlling to change a radius of rotation, a coating radius, a coating pressure of the glue coating portion 130.

Figure 4:
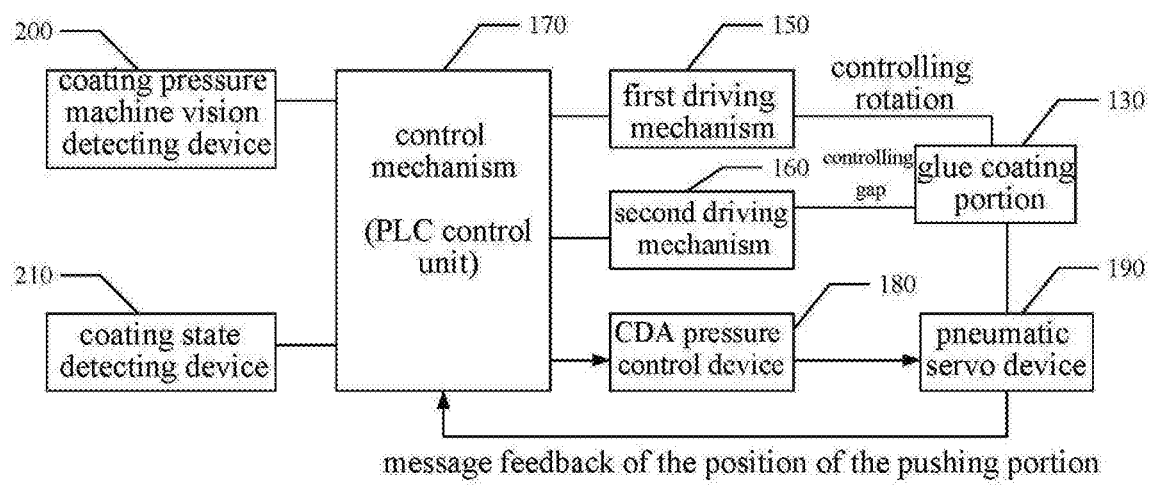
FIG. 4 schematically shows a control schematic view of still another curved surface coating device in an exemplary arrangement of the present disclosure.

Specifically, the PLC control unit may also be successively electrically connected with a CDA (Compressed Dry Air) pressure control device 180 and a pneumatic servo device 190, as shown in FIG. 4. The pneumatic servo device 190 is connected with the glue coating portion 130 (for example, connected with a third driving mechanism, i.e., a stepping motor), and may be used to feed back a position information of the pushing portion 133 (in the glue coating portion 130) in the glue storage chamber 132 to the PLC control unit, and the position information may be used to calculate the coating pressure of the glue coating portion 130. It should be noted that the CDA pressure control device 180 and the pneumatic servo device 190 are existing mature apparatuses in the current glue application apparatuses, and the specific structure and working principle thereof will not be described again.

Figure 3:
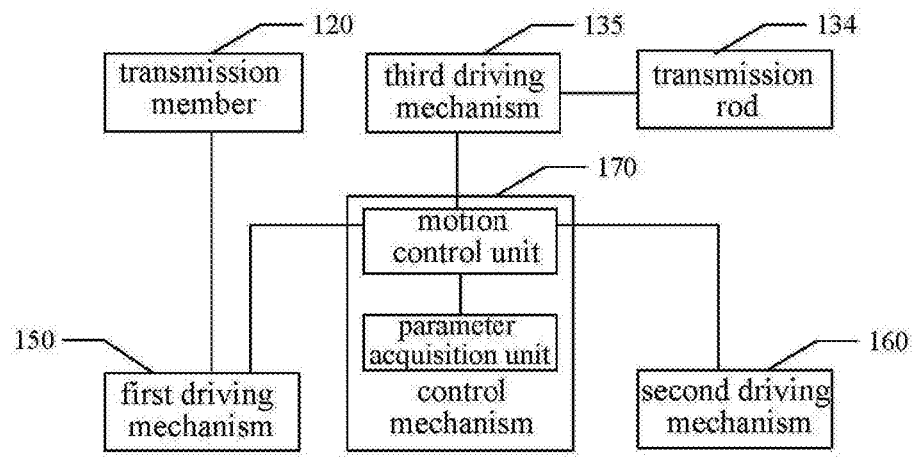
FIG. 3 schematically shows a control schematic view of another curved surface coating device in an exemplary arrangement of the present disclosure.

Referring to FIG. 3, illustratively, the control mechanism 170 may include a parameter acquisition unit and a motion control unit. The parameter acquisition unit is configured to acquire a rotation speed parameter, a gap parameter from substrate, and a coating pressure parameter. As shown in FIG. 4, specifically, the PLC control unit may also be electrically connected with a coating pressure machine vision detecting device 200 and a coating state detecting device 210. The coating state detecting device 210 may be configured to detect a rotation speed parameter and a gap parameter of the glue coating portion 130, and the coating pressure machine vision detecting device 200 may be configured to acquire a coating pressure parameter. It should be noted that the coating pressure machine vision detecting device 200 and the coating state detecting device 210 are also existing mature apparatuses in the current glue coating apparatuses, and the specific structure and working principle thereof will not be described again.

The motion control unit is connected with the parameter acquisition unit for controlling a power output of the first driving mechanism 150 according to the rotation speed parameter, a power output of the second driving mechanism 160 according to the gap parameter, and a power output of the third driving mechanism 135 according to the coating pressure parameter. For the specific control process of these three driving mechanisms, reference may be made to the following description of the exemplary working process of the curved surface coating device, and with continued reference to FIGS. 1 to 4, the working process may include the following blocks 301-307:

Block 301: setting an initial curvature on the control mechanism 170 to control a rotation shaft (i.e., the transmission member 120) to move into a designated position. That is, the glue coating portion 130 is controlled to move into a designated position to match with a curved surface substrate 140 to be coated.

Block 302: setting parameters such as an initial rotation speed, a gap value, a coating pressure, and an error upper limit on the control mechanism 170. Specifically, the control mechanism 170 may include an input/output apparatus (not shown) such as a touch display screen or a keyboard through which the above initial parameters may be set.

Block 303: controlling a detection of the coating state by the control mechanism 170. For example, angles of two infrared camera tubes and a state of a horizontal infrared camera tube located at the upper portion of the curved surface coating device in the coating state detecting device 210 (not shown) are detected.

Block 304: controlling the coating portion 130 by the control mechanism 170 to rotate to perform a coating operation, and controlling a discharge amount of the coating glue.

Specifically, during coating, the control mechanism 170 controls the first driving mechanism 150 to drive the rotation shaft to rotate so that the bracket 110 brings the coating head 131 of the glue coating portion 130 to rotate on the surface of the curved surface substrate 140. The rotation speed is controlled to adjust possible conditions and make the coating more uniform. The control mechanism 170 simultaneously controls the third driving mechanism 135 to control the movement of the transmission rod 134 of the glue coating portion 130, thus driving the pushing portion 133 to move so that a space in the glue storage chamber 132 becomes smaller and an outward thrust is generated to the coating glue to extrude the coating glue from the slit of the coating head 131. The coating glue is applied to the surface of the curved surface substrate 140 as the coating head 131 rotates. In this process, the discharge amount of the coating glue may be adjusted according to the coating pressure control.

The control mechanism 170 may also control the second driving mechanism 160 to drive the rotation shaft to linearly move (corresponding to the P direction), thus bringing the coating head 131 of the glue coating portion 130 to move linearly through the bracket 110 to change a gap between the coating head 131 and the surface of the curved surface substrate 140. Illustratively, the gap is controlled in the range of 10 um to 30 um; by controlling the gap to be in the range of 10 um to 30 um, it can ensure that the coated coating glue meets requirements without excessive waste. During the coating process, the coating state detecting device 210 may detect the unevenness of the surface of the curved surface substrate 140, thus to adaptively dynamically adjust the height of the coating head 131 to maintain the gap between the coating head 131 and the surface of the curved surface substrate 140, so that the curved surface substrate 140 is coated with high precision and uniformity.

Block 305: monitoring a pressure control through the coating effect. For example, the actual desired coating pressure is detected by the coating pressure machine vision detecting device 200, and the control mechanism 170 calculates the current coating pressure according to the current position information of the pushing portion 133 returned by the pneumatic servo device 190. The current coating pressure is adjusted according to the actual desired coating pressure to extrude an appropriate amount of coating glue. When the cross-sectional area of the current coating exceeds upper limit of the error compared with that of the previous coating, a size of the error is output to a line adjusting device of the glue coating apparatus.

Block 306: going into the next coating cycle if the upper limit of the error is not exceeded, and returning the above block 303 to continue the above blocks and thus to complete the coating of the entire curved surface substrate 140. In this arrangement, the coating radius may be adjusted according to the curvature of curved surface of the curved surface substrate 140, the local protrusion or the like during the coating process to apply the coating glue with high precision and uniformity.

Further, in the present exemplary arrangement, a glue coating device (not shown) is also provided. The glue coating apparatus may include the curved surface coating device described in any of the above arrangements.

In an exemplary arrangement, the apparatus may further include a feed passage and a material circulation passage (not shown). The feed passage is configured to receive a coating glue. Illustratively, the feed passage may be a passage located on the transmission member 120 or the bracket 110. The material circulation channel is connected between the feed passage and the glue storage chamber 132 of the glue coating portion 130 for feeding a complementary coating glue into the glue storage chamber 132 of the glue coating portion 130. Illustratively, a volume of the material circulation passage is larger than that of the storage chamber 132. If a cross-section of the material circulation passage is rectangular or circular, a diameter or a side length thereof is larger than that of the storage chamber 132, so that the coating glue may be quickly replenished. The apparatus may further include a control valve (not shown) disposed between the feed passage and the glue coating portion 130 for controlling a transportation process of the coating glue.

Illustratively, the control valve may be an electronically controlled valve, for example, two electronically controlled valves may be provided, one of which is disposed on the glue coating portion for opening/closing the glue storage chamber 132 in the glue coating portion 130 and one of which is disposed at an opening of the feed passage for opening/closing the feed passage. When the coating glue is insufficient, the valve that feeds the material is controlled to replenish the coating glue. When the replenishment of the coating is completed, the valve of the glue storage chamber 132 is opened, and the valve for feeding is closed.

The glue coating apparatus may move and change the position of the transmission member 120 (i.e., the rotation shaft) to change the position of the coating head 131 according to the coating path requirement, so as to achieve control of the curvature of the coating path. The above-described curved surface coating device and the glue coating apparatus shown in the exemplary arrangement have an adjustable curvature coating path, and the position of the coated surface is controllable, so that the coating glue can be easily coated on the curved surface substrate having buckling or unevenness with high precision and uniformity. Therefore, it can be adapted to multi-curvature or single curvature coating operation, and has a wide application range.

Other arrangements of the present disclosure will be apparent to those skilled in the art after reading the specification and implementing the disclosure described herein. The present application is intended to cover any variations, purposes, or adaptations of the present disclosure, which are in accordance with the general principles of the present disclosure and include common general knowledge or conventional technical means in the art that are not disclosed in the present disclosure. The specification and arrangements are to be regarded as illustrative only, and the real scope and spirit of the present disclosure is defined by the attached claims.

What is claimed is:

1. A curved surface coating device, comprising: a bracket having a first end and a second end; a glue coating portion connected with the first end of the bracket; a rotation shaft connected between the first end and the second end of the bracket, wherein a distance between the first end and the rotation shaft is adjustable; a first driving motor connected with the rotation shaft and configured to drive the bracket to rotate about the rotation shaft as a center of rotation; a second driving motor connected with the bracket and configured to drive the bracket to move on a line where the first end and the second end are located, wherein the glue coating portion comprises; a coating head having a circular arc surface with a slit; a glue storage chamber, one end of which is hermetically connected with the coating head; a piston located within the glue storage chamber and matching a size of the glue storage chamber; a transmission rod, a first end of which extends into the glue storage chamber and is connected with the piston; and a third driving motor connected with a second end of the transmission rod configured to drive the transmission rod with an axial movement along the glue storage chamber, wherein a programmable logic controller (PLC) is electrically connected with the first driving motor, the second driving motor, and the third driving motor for controlling respective power outputs of the first driving motor, the second motor, and the third driving motor, the second driving motor, and acquisition controller unit for acquiring a rotation speed parameter, a gap parameter from a substrate, and a coating pressure parameter; a motion controller connected with the parameter acquisition controller unit for controlling the power output of the first driving motor according to the rotation speed parameter, the power output of the second driving motor according to the gap parameter, and the power output of the third driving motor according to the coating pressure parameter.

2. The curved surface coating device according to claim 1, wherein the gap parameter comprises a gap between the coating head and a surface of the substrate, and the gap ranges from 10 micrometer to 30 micrometer.

3. A glue coating apparatus, comprising a curved surface coating device, wherein the curved surface coating device comprises: a bracket having a first end and a second end; a glue coating portion connected with the first end of the bracket; a rotation shaft connected between the first end and the second end of the bracket, a distance between the first end and the rotation shaft is adjustable; a first driving motor connected with the rotation shaft and configured to drive the bracket to rotate about the rotation shaft as a center of rotation; a second driving motor connected with the bracket and configured to drive the bracket to move on a line where the first end and the second end are located, wherein the glue coating portion comprises: a coating head having a circular arc surface with a slit; a glue storage chamber, one end of which is hermetically connected with the coating head; a piston located within the glue storage chamber and matching a size of the glue storage chamber; a transmission rod, a first end of which extends into the glue storage chamber and is connected with the piston; and a third driving motor connected with a second end of the transmission rod configured to drive the transmission rod with an axial movement along the glue storage chamber, wherein a programmable logic controller (PLC) is electrically connected with the first driving motor, the second driving motor, and the third driving motor for controlling respective power outputs of the first driving motor, the second driving motor, and the third driving motor, said PLC comprises: a parameter acquisition controller unit for acquiring a rotation speed parameter, a gap parameter from a substrate, and a coating pressure parameter; a motion controller connected with the parameter acquisition controller unit for controlling the power output of the first driving motor according to the rotation speed parameter, the power output of the second driving motor according to the gap parameter, and the power output of the third driving motor according to the coating pressure parameter.

4. The curved surface coating device according to claim 3, wherein the gap parameter comprises a gap between the coating head and a surface of the substrate, and the gap ranges from 10 micrometer to 30 micrometer.

5. The glue coating apparatus according to claim 3, wherein the apparatus further comprises: a feed passage for receiving a coating glue; a material circulation passage connected between the feed passage and the glue storage chamber of the glue coating portion.

6. The glue coating apparatus according to claim 5, wherein a volume of the material circulation passage is larger than a volume of the glue storage chamber.

* * * * *